United States Patent [19]
Rogers

[11] 4,096,453
[45] Jun. 20, 1978

[54] DOUBLE-MODE TUNED MICROWAVE OSCILLATOR

[75] Inventor: Robert G. Rogers, Los Altos, Calif.

[73] Assignee: GTE Automatic Electric Laboratories Incorporated, Northlake, Ill.

[21] Appl. No.: 798,280

[22] Filed: May 19, 1977

[51] Int. Cl.$^2$ ............................................. H03B 5/18
[52] U.S. Cl. ................................ 331/117 D; 331/99; 333/84 M
[58] Field of Search ...................... 331/117 D, 99, 100, 331/101, 102; 333/84 M

[56] References Cited

U.S. PATENT DOCUMENTS

| | | | |
|---|---|---|---|
| 3,516,021 | 6/1970 | Kohn | 331/99 |
| 3,699,475 | 10/1972 | Rogers | 333/84 M |
| 3,745,488 | 7/1973 | Rogers | 333/84 M |

OTHER PUBLICATIONS

"A Dual Mode Tuning Circuit for Microwave Transistor Oscillators," R. G. Rogers, volmtt-25, No. 2, Feb. 1977, pp. 120–126.

Primary Examiner—John Kominski
Attorney, Agent, or Firm—Russell A. Cannon; Leonard R. Cool

[57] ABSTRACT

The embedding network of a microwave oscillator comprises three lengths of parallel conductors supported above a ground plane and having odd and even mode short circuits thereon. Two of the conductors are connected to different ones of the electrodes of a bipolar microwave transistor which has a third electrode connected to ground. A load is connected between the third conductor and ground. Physical and electrical characteristics of the network are varied to cause parameters thereof to be desired values which yield maximum output power and oscillation at desired frequencies.

26 Claims, 23 Drawing Figures

DOUBLE-MODE TUNED MICROWAVE OSCILLATOR

BACKGROUND OF INVENTION

This invention relates to microwave oscillators in which the frequency and power output thereof are controlled by double-mode tuning and more particularly to such a microwave oscillator in which characteristics thereof may be selected to provide optimum power output to a load impedance of any prescribed value. A double-mode tuned oscillator is one including structure supporting both odd and even mode fields which may be adjusted.

A prior art microwave oscillator is described in U.S. Pat. No. 3,699,475, which issued Oct. 17, 1972. Such an oscillator is also described in the article A Dual Mode Tuning circuit for Microwave Transistor Oscillators, IEEE Transaction MTT 25-2, Feb. 1977, pgs. 120–127. The oscillator in the patent comprises a single transistor and only a pair of parallel conductors having a pair of short circuits thereon which produce odd and even mode fields on the conductors. The collector and base electrodes of the microwave transistor there are connected to associated conductors, the emitter electrode being connected to a reference potential. An output signal is coupled from the collector electrode of the transistor. It has been found that the output admittance of that oscillator is complex, i.e., it includes a susceptance rather than being purely conductive. In order to obtain maximum output power from the oscillator, it is then necessary to either employ a complex load impedance which would have a different value for each frequency of oscillation or to employ an impedance matching network to transform the impedance at the oscillator output port into a pure resistance such as 50 ohms. Although this may be readily accomplished, it is inconvenient to have to do this.

An object of this invention is a provision of an improved double-mode tuned microwave oscillator in which the characteristics thereof may be readily selected so that its output impedance is purely conductive and is a prescribed value.

SUMMARY OF INVENTION

In accordance with this invention, the embedding network of a microwave oscillator comprises a pair of transmission line sections, each of which includes lengths of a plurality of at least three parallel conductors supported with respect to a ground plane with an associated odd or even mode short circuit on the conductors, only two of the conductors of each line section being electrically connected to associated electrodes of a microwave transistor. The third electrode of the transistor is electrically connected to ground. An output signal is coupled from third conductors of the two line sections. With at least three parallel conductor lengths in each transmission line section, the physical and electrical characteristics of the transmission line sections may be adjusted to make the output impedance of the embedding network at the third conductors purely resistive.

BRIEF DESCRIPTION OF DRAWINGS

This invention will be more fully understood from the following detailed description thereof in which the same or primed reference numerals are used to designate the same or similar parts throughout the several figures wherein.

DESCRIPTION OF PREFERRED EMBODIMENTS

Figure 1:
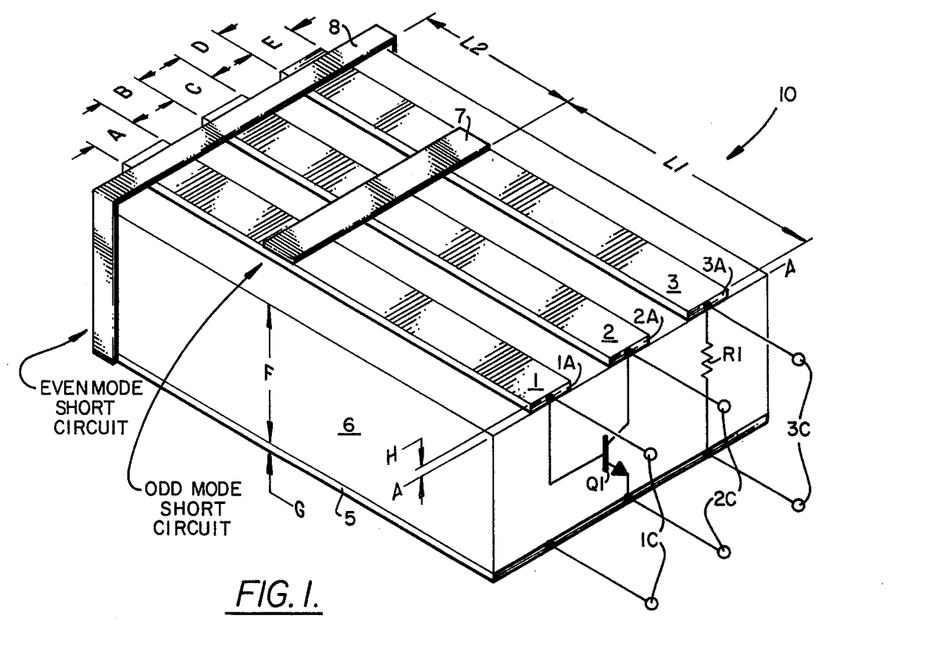
FIG. 1 is a perspective illustration of a microstrip oscillator 10 embodying this invention and including combined even and odd mode transmission line sections.

The preferred embodiment of this invention in FIG. 1 is a microstrip oscillator 10. It comprises a microwave transistor Q1 and a load impedance R1 which are connected to a microstrip transmission circuit including three electrically conductive lines or conductors 1,2 and 3 which are each spaced the same distance F from an electrically conductive ground plane 5 by a dielectric body 6. The load impedance is a resistor R1 which is electrically connected between the line 3 and ground. The transistor has base and collector electrodes electrically connected to the other two lines 1 and 2, respectively, and has an emitter electrode electrically connected to ground. The output for the oscillator 10 is R1. The lines 1–3 are preferably parallel to each other in a common plane, although they may be located in different planes. Also, they may have different physical dimensions and spacings as is described more fully hereinafter. The lines 1–3 are short circuited together by a first electrically conductive strip 7 which is located at the same distances L1 from associated one ends 1A-3A thereof. The shorting strip 7 is electrically insulated from the ground plane 5 by the dielectric body 6. The lines 1–3 are also electrically short circuited together and to the ground plane 5 by a second electrically conductive strip 8 which is located at the same distances L1 + L2 from the one ends thereof.

Transmission lines and structures including microwave oscillators supporting odd and even modes are described in the literature such as the Van Hofweegan U.S. Pat. No. 2,502,766, issued Apr. 4, 1950; the Rogers U.S. Pat. No. 3,699,475, issued Oct. 17, 1972; and the Rogers U.S. Pat. No. 3,745,488, issued July 10, 1973. Coupled pairs of transmission lines are described in more detail in the articles, Parameters of Microstrip Transmission Lines and of Coupled Pairs of Microstrip Lines by Thomas G. Bryant and Gerald A. Weiss, IEEE Transactions MTT-16.12, Dec. 1968, pages 1021–1027, a paper of the same title designated document NAPS-00087 being available through ADI Auxiliary Publication Services, American Society for Information Sciences, Inc., c/o CCM Information Sciences, Inc., 22 W. 34th Street, New York, N.Y. 10001; Coupled Strip Transmission Line Filters and Directional Couplers by E. M. T. Jones et al, IRE Transactions MTT-4, April 1956, pages 75–81; and the book Microwave Filters, Impedance Matching and Coupling Structures by G. Matthaei, et al, McGraw Hill Book Company, 1964. Transmission lines including three or more parallel conductors are also described in the articles, Simplified Analysis of Coupled Transmission Line Networks by R. Sato, et al, IEEE Transactions MTT-18.3, March 1970, pages 122–131; Coupled Strip Transmission Line With Three Center Conductors by S. Yamamoto, et al, IEEE Transactions MTT-14.10, October 1966, pages 446–461; and The Design And Performance of Three Line Microstrip Couplers by D. Pavlidis, IEEE Transactions MTT-24.10, October 1976, pages 631–640. These references are incorporated herein by reference.

The microstrip structure in FIG. 1 comprising conductors 1–3 and ground plane 5 supports both even and odd mode fields. The conductors 1–3 have even mode currents thereon which are in-phase at adjacent points across the conductors, i.e., the conductors are at the same potential at adjacent points for the even mode. The currents on the conductors for odd modes, however, are 180° out-of-phase at adjacent points across the conductors 1–3. Thus, the short circuit produced by strip 7 has no effect on even modes on conductors 1–3. The strip 7 produces a short circuit, however, for the odd modes. The strip 8 produces a short circuit for both odd and even modes since it electrically connects the conductors 1–3 together and to ground. It is apparent therefore that the lengths L1 of conductors 1–3 support both even and odd mode fields whereas the lengths L2 thereof normally support only even mode fields. The strip 7 and microstrip structure including the lengths L1 of conductors 1–3 are therefore referred to as an odd mode short circuit and an odd mode transmission line, respectively. Similarly, the strip 8 and microstrip structure including the lengths L1 + L2 of conductors 1–3 are referred to as an even mode short circuit and an even mode transmission line, respectively. The lengths of the odd mode lines are adjusted primarily by changing the position of the strip 7. The lengths of the even mode lines are adjusted primarily by changing the position of only the strip 8.

As is described more fully hereinafter, proper selection of Q1 and characteristics of the microstrip structure causes the circuit 10 in FIG. 1 to oscillate at a desired frequency. The use of a third line 3 here makes it possible to design the oscillator to have an output impedance between the one end 3A of the line and the ground plane 5 that is purely resistive and of a prescribed value. The operating frequency of the oscillator is primarily related to the position of the odd mode short circuit 7 on the lines whereas the position of the even mode short circuit 8 has a principal affect on the value of the output impedance of the oscillator. The physical locations of the strips 7 and 8 on the lines 1–3 are therefore varied to accomplish the desired associated tuning in the oscillator circuit.

The design of transistor oscillators is generally described in articles such as, A Design Basis For Junction Transistor Oscillator Circuits by D. F. Page, IRE Proceedings, Vol. 46, June 1958, pages 1271–1280; On Oscillator Design For Maximum Power by M. Vehovec, et al, IEEE Transactions CT-15.3, September 1968, pages 281–283; and A Dual Mode Tuning Circuit for Microwave Transistor Oscillators by Robert G. Rogers, IEEE Transactions MTT-25.2, February 1977, pages 120–127. These articles are incorporated herein by reference. The first two figures in the Vehovec article are combined in the FIG. 2 here.

Figure 2:
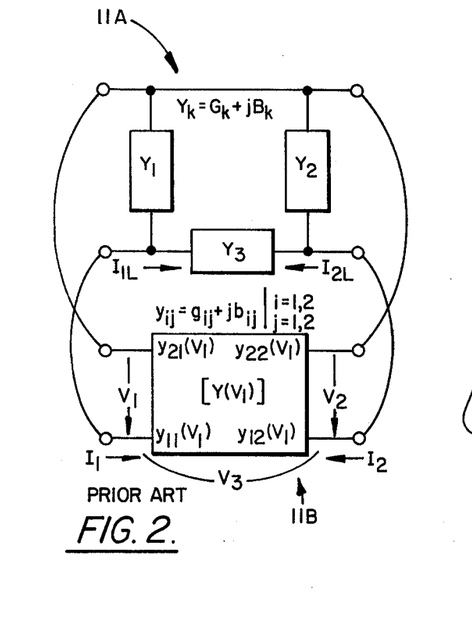
FIG. 2 is a schematic block diagram of an oscillator as outlined in the Vehovec article (infra)

In accordance with the teachings of Vehovec, an oscillator is defined in terms of a $\pi$-section embedding network 11A in FIG. 2 which is connected to provide positive feedback around an active element which is represented by box 11B. Requirements on the embedding network 11A for the circuit to oscillate are specified in the article.

Figure 3:
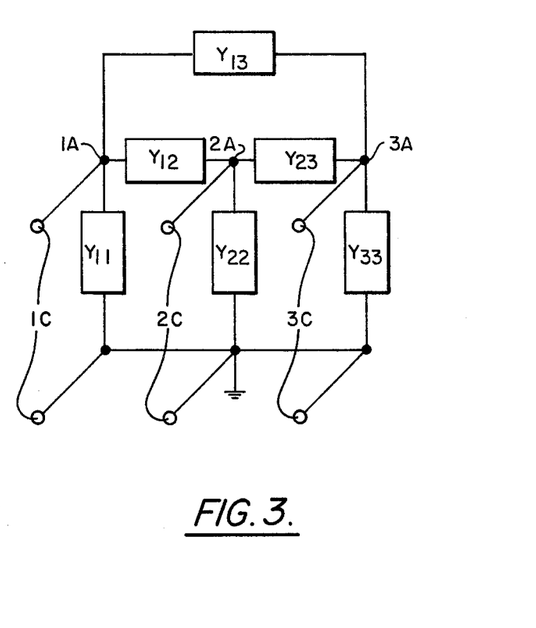
FIG. 3 is a schematic block diagram illustrating the electrical equivalent circuit of the embedding network of the oscillator 10 in FIG. 1 (without the transistor Q1 and load impedance R1)

In the oscillator 10 in FIG. 1, the embedding network consists of the three conductor microstrip structure (including the shorting elements 7 & 8), exclusive of Q1 (the active element) and the load impedance R1 there. The electrical equivalent circuit of this embedding network is shown in FIG. 3. Techniques for determining network equations and circuit equivalents for n-conductor coupled transmission lines (where $n \geq 3$) are described in articles referenced above. Using similar techniques, it is possible to reduce the FIG. 3 electrical equivalent circuit representation of this embedding network, with or without the load impedance R1, to a simple $\pi$-section network. By properly defining the characteristics of the embedding network in relation to parameters of the microwave transistor Q1, the circuit 10 is made to oscillate at a prescribed frequency. The design of an oscillator embodying this invention will now be outlined.

The electrical equivalent circuit of the embedding network in the oscillator 10 of FIG. 1 is shown in FIG. 3. The equivalent circuit is presented in a different form in FIG. 4 where the lines interconnecting the representations of admittances are assumed to be of zero electrical length. The electrical equivalent circuit in FIG. 3 consists of the shunt admittances $Y_{11}$, $Y_{22}$, and $Y_{33}$ which are connected across associated parts 1C, 2C and 3C and the series admittances $Y_{12}$, $Y_{23}$, and $Y_{13}$ which are connected between associated one ends of different ones of the lines 1–3. These admittances $Y_{mn}$, where $m \leq n \leq 3$, are representable as:

$$Y_{11} = jB_{11} = -jY_{oe1} \cot(\theta 1 + \theta 2) \quad (1)$$

$$Y_{22} = jB_{22} = -jY_{oe2} \cot(\theta 1 + \theta 2) \quad (2)$$

$$Y_{33} = jB_{33} = -jY_{oe3} \cot(\theta 1 + \theta 2) \quad (3)$$

$$Y_{12} = +jB_{12} = j\left(\frac{(Y_{oe1} Y_{oe2})}{(Y_{oe1} + Y_{oe2} + Y_{oe3})}\right)\{\cot(\theta 1 + \theta 2) - \cot \theta 1\} \quad (4)$$
$$- j(\tfrac{1}{2})(Y_{oo1} - Y_{oe1}) \cot \theta 1 \quad (5)$$

$$Y_{13} = +jB_{13} = j\left(\frac{(Y_{oe1} Y_{oe3})}{(Y_{oe1} + Y_{oe2} + Y_{oe3})}\right)\{\cot(\theta 1 + \theta 2) - \cot \theta 1\} \quad (6)$$

$$Y_{23} = +jB_{23} = j\left(\frac{(Y_{oe2} Y_{oe3})}{(Y_{oe1} + Y_{oe2} + Y_{oe3})}\right)\{\cot(\theta 1 + \theta 2) - \cot \theta 1\}$$
$$- j(\tfrac{1}{2})(Y_{oo3} - Y_{oe3}) \cot \theta 1$$

where $Y_{oe1}$, $Y_{oe2}$, and $Y_{oe3}$ are the even mode characteristic admittances of lines 1, 2 and 3 across ports 1C, 2C and 3C, respectively; $Y_{oo1}$, $Y_{oo2}$ and $Y_{oo3}$ are the odd mode characteristic admittances of lines 1–3 across ports 1C, 2C and 3C, respectively; $\theta 1 = \beta L1$; $\theta 2 = \beta L2$; $\beta = 2\pi/\lambda$ is the phase constant; $\lambda = (1/2\pi f)$ is the effective wavelength of the circuit; and $f$ is the operating frequency of the oscillator.

An even mode characteristic admittance $Y_{oe}$ is defined as the admittance appearing between a particular line and the ground reference potential when equal in-phase voltages are present along the lines. An odd mode characteristic admittance $Y_{oo}$ is defined as the admittance appearing between a particular line and the ground reference potential when voltages along the lines are 180° out-of-phase. These characteristic admittances can be measured directly. They also can be determined empirically since they are a function of the widths A, C and E of the lines 1–3, the thickness F and dielectric constant of block 6, and the spacings B and D of the lines as is stated in the Pavlidis article and shown in curves which may be derived from the tables presented in the Bryant and Weiss article, supra.

Figure 4:
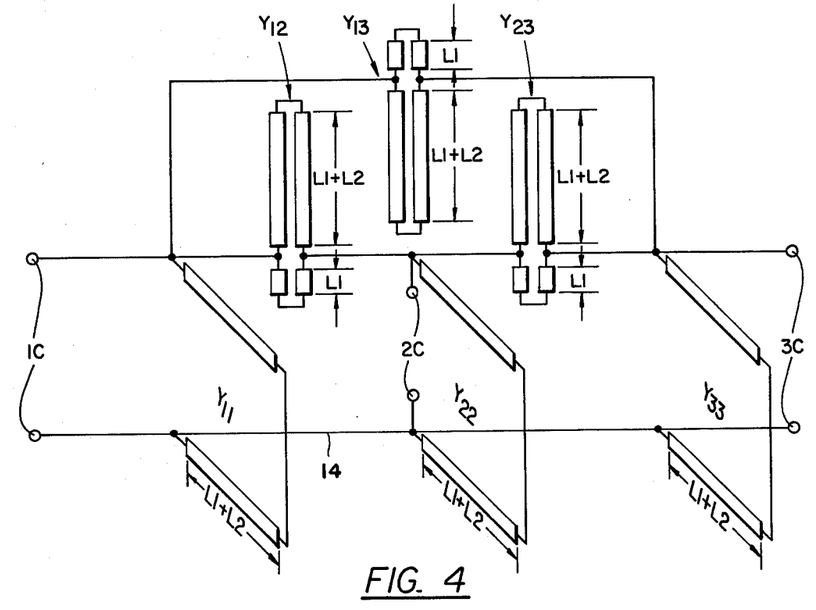
FIG. 4 is a schematic diagram providing an alternate representation of the electrical equivalent circuit of FIG. 3.

The lines 1, 2 and 3 in FIG. 1 are coupled together. In the FIG. 4 equivalent circuit of these lines, however, the lines in FIG. 4 are not coupled to each other. For example, the line of length L1 + L2 in FIG. 4 that relates to the admittance $Y_{11}$ is not coupled electromagnetically along its lengths to the line of length L1 + L2 which relates to $Y_{22}$, but only by the zero-electrical length wires 14 between them. At corresponding ports 1C, 2C and 3C, however, the circuit of FIG. 4 behaves exactly like the circuit of FIG. 1 even though the circuits differ internally.

The second terms in equations 4 and 6 are seen to be related to direct coupling between adjacent ones of the lines 1–3. There is no corresponding second term in equation 5 since it is assumed that there is no direct coupling between lines 1 and 3, which have another line 2 therebetween. Measurements of characteristic admittances show that this assumption is substantially correct. Reference to equations 1–6 reveals that each of the admittances $Y_{mn}$ defined here and in a corresponding box in FIG. 3 consists of short circuited lengths L1 or L1 + L2 of transmission line which are not coupled electromagnetically along the lengths thereof, but only by their connections at their open ends.

It has been determined that the lengths L1 and L2 of the lines 1–3 have separate functions, although this may not be apparent from equations 1–6 and FIGS. 3 and 4 since both of these line lengths contribute to each of the admittances defined in these equations. The series admittance $Y_{12}$ in this oscillator 10 produces the approximately 180° phase shift that is required for the conditions of oscillation to be satisfied. This means that the lengths L1 of the lines are approximately a half-wavelength long such that they produce something approximating a short circuit across the series elements $Y_{12}$, $Y_{13}$, and $Y_{23}$. This means that the lengths L2 of the lines have little effect on determining the operating frequency of the oscillator compared to the short circuiting affect of the lengths L1 thereof. It can therefore be concluded that the lengths L1 of the lines have a primary affect on the values of the series elements $Y_{12}$, $Y_{23}$, and $Y_{13}$, whereas the lengths L2 of the lines primarily affect values of the shunt elements $Y_{11}$, $Y_{22}$, and $Y_{33}$ and, thus, the output admittance of the circuit. Stated differently, the admittances $Y_{11}$, $Y_{22}$, and $Y_{33}$ are primarily functions of the line lengths L2 because the line lengths L1 are about a half-wavelength long, which moves the short circuit 7 up to the one ends 1A, 2A, and 3A of the lines. The admittances $Y_{12}$, $Y_{23}$, and $Y_{13}$ are primarily functions of the line lengths L1 because these line lengths are nearly a half-wavelength long and produce low impedances for these admittances at the one ends of the lines so that the line lengths L1 + L2 have little effect on them.

Although values of the admittances $Y_{mn}$ defined by equations 1–6 are needed to design the oscillator 10 in FIG. 1, it is impractical to calculate them directly since there are only six equations available which contain nine variables ($Y_{mn}$ for $m \leq n \leq 3$, the line lengths L1 and L2 and the frequency $f$). The design of the oscillator 10 will be simplified if the embedding network of FIG. 3 can be reduced to the simple $\pi$-section network in FIG. 2.

Figure 5:
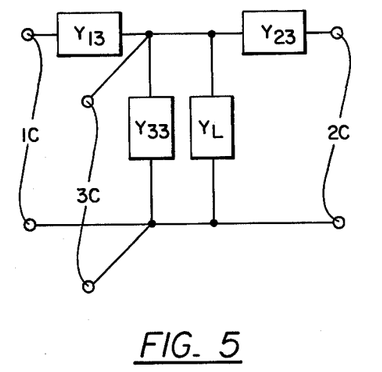
FIGS. 5–8 are schematic diagrams representing different impedance configurations of various combinations of elements in the oscillator 10 in FIG. 1, and which are useful in explaining the design of a microwave oscillator embodying this invention.
Figure 6:
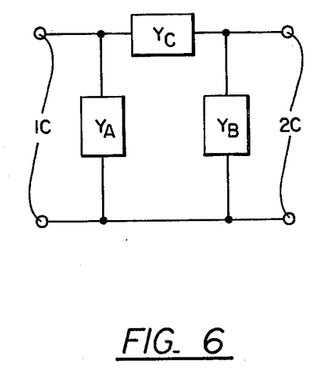
Figure 7:
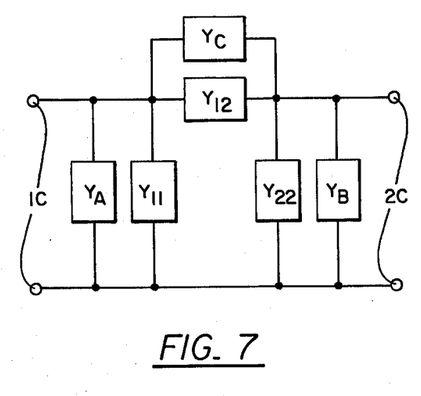
Figure 8:
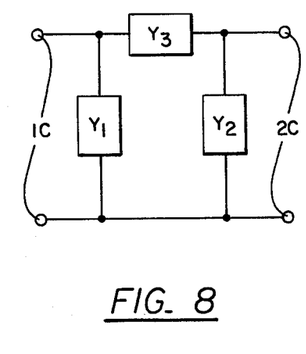

The Q1 base-emitter and collector-emitter junctions are connected across ports 1C and 2C, respectively, of the circuit in FIG. 3, the load impedance R1 being connected across the other port 3C. This circuit representation in FIG. 3 may be viewed as the combination of a simple $\pi$-section made up of the admittance elements $Y_{11}$, $Y_{12}$, and $Y_{22}$ which are connected in shunt with the Q1 base-emitter, base-collector, and collector-emitter junctions, respectively; together with a T-section comprising series arms including the admittance elements $Y_{13}$ and $Y_{23}$ and a shunt arm including the parallel combination of the admittance element $Y_{33}$ and the load admittance $Y_L$. This T-section, which is illustrated in FIG. 5, may be converted to the equivalent $\pi$-section shown in FIG. 6 using T-$\pi$ conversion formulas in a manner which is well known. When the $\pi$-section in FIG. 6 is substituted for the original T-section (elements $Y_{13}$, $Y_{23}$, $Y_{33}$, and $Y_L$) in FIG. 3, the equivalent circuit there then reduces to that shown in FIG. 7 where the two π-sections of FIGS. 3 and 6 are connected in parallel. Pairs of admittances in FIG. 7 are combined to produce the simple π-section in FIG. 8. The admittance elements in FIG. 8 are of the desired form $Y_i = G_i + jB_i$, where $i = 1, 2,$ and 3. Associated conductances and susceptances there are representable as $$G_1 = G_L \frac{(B_{13}(B_{13} + B_{23}))}{(G_L^2 + (B_{13} + B_{23} + B_{33})^2)} \tag{7}$$

$$G_2 = G_L \frac{(B_{23}(B_{13} + B_{23}))}{(G_L^2 + (B_{13} + B_{23} + B_{33})^2)} \tag{8}$$

$$G_3 = -G_L \frac{(B_{13} B_{23})}{(G_L^2 + (B_{13} + B_{23} + B_{33})^2)} \tag{9}$$

$$B_1 = B_{11} + B_{13} \frac{(G_L^2 + B_{33}(B_{13} + B_{23} + B_{33}))}{(G_L^2 + (B_{13} + B_{23} + B_{33})^2)} \tag{10}$$

$$B_2 = B_{22} + B_{23} \frac{(G_L^2 + B_{33}(B_{13} + B_{23} + B_{33}))}{(G_L^2 + (B_{13} + B_{23} + B_{33})^2)} \tag{11}$$

$$B_3 = B_{12} + \frac{(B_{13} B_{23}(B_{13} + B_{23} + B_{33}))}{(G_L^2 + (B_{13} + B_{23} + B_{33})^2)} \tag{12}$$

By any one of several methods, values of the six quantities $G_i$ and $B_i$ may be specified to satisfy the conditions for oscillation, for a selected value of load conductance $G_L$.

The transistor Q1 of oscillator 10 in FIG. 1 is connected in a common emitter configuration. This transistor Q1 may be considered as a two-port network such as box 11B in FIG. 2 which is defined by the four "s" parameters $s_{ij}$, where $i = 1, 2$ and $j = 1, 2$ here. The parameters $s_{11}$ and $s_{22}$ of Q1 represent the reflection coefficients at first and second ports, respectively, when the other port is terminated in 50 ohms, for example. The parameters $s_{12}$ and $s_{21}$ represent the transmission loss between associated ports. In practice, it is desirable that $|s_{21}| > 1$ and $|s_{12}| < 1$. These s parameters are measured for a particular type of transistor at each frequency of desired operation. The measured "s" parameters are converted to admittance parameters ($y_{ij} = g_{ij} + jb_{ij}$) in the conventional manner to simplify analysis of the oscillator.

In accordance with the Vehovec and Rogers articles and FIG. 2, the conditions for oscillation are that $I_1 + I_{1L} = 0$ and $I_2 + I_{2L} = 0$. Consider that the voltage ratio $A = V_2/V_1 = A_R + jA_I$ is chosen so that the oscillator generates power; that the two conductances G1 and G3 in equations 7-12 are chosen to be positive and small, i.e., G1 = G3 = 0; and that G2 is also positive. This means that the output power resides in the conductance G2. Then expressing the four currents in FIG. 2 in terms of the two-port matrices of the active element Q1 and the embedding network, one obtains the linear design equations $$\begin{bmatrix} G_2 \\ B_1 \\ B_2 \\ B_3 \end{bmatrix} \begin{bmatrix} 0 & 0 & 0 & A_I \\ 0 & 1 & 0 & (1-A_R) \\ A_R & 0 & -A_I & -A_I \\ A_I & 0 & A_R & -(1-A_{RI}) \end{bmatrix} = \begin{bmatrix} C \\ D \\ E \\ F \end{bmatrix} \tag{13}$$

where $$C = -g_{11} - Re (Ay_{12});$$

$$D = -b_{11} - Im (Ay_{12});$$

$$E = -g_{21} - Re (Ay_{22});$$

$$F = -b_{21} - Im (Ay_{22}) \tag{14}$$

Values of the susceptances B1, B2, and B3, as a function of the transistor $y_{ij}$ parameters, are then determined to be $$B_1 = D - \frac{(1 - A_R)}{A_I} C \tag{15}$$

$$B_2 = -\frac{C}{A_I} + \frac{(A_R C + A_I(A_R F - A_I E))}{(A_I(A_R^2 + A_I^2))} \tag{16}$$

$$B_3 = \frac{C}{A_I}. \tag{17}$$

The conductances G2 here, which now corresponds to the load impedance, is assigned a desired value such as 50 ohms.

The six quantities in the left of equations 7-12 are numbers for each frequency of oscillation. Reference to these equations 7-12 reveals that there are now only six unknowns here ($B_{mn}$, $m \leq n \leq 3$, the value of the load admittance $G_L$ having been previously specified). Numerical values of each of these six quantities can now be calculated. In practice, it maybe desirable to set certain ones of the susceptances $B_{mn}$ in equations 7-12 equal to the same or similar values in order to simplify calculating values of other parameters there. By way of example, $B_{13}$ maybe set equal to $-B_{23}$. From equations 7 and 8, this would cause $G_1 = 0$ and $G_2 = 0$. Solving equations 7-12 for the other four unknowns on the right sides thereof gives certain conditions imposed on the embedding network for the oscillator to operate at a selected frequency. Substituting values of the quantities $B_{mn}$ in associated ones of the equations 1-6 reveals that there are now seven unknowns here, i.e., three even mode admittances $Y_{oe1}$, $Y_{oe2}$, and $Y_{oe3}$, two odd mode characteristic admittances $Y_{oo1}$ and $Y_{oo3}$, and the two line lengths $\theta 1 = \beta L1$ and $\theta 2 = \beta L2$. Assigning at least one of these seven quantities a reasonable value or setting any two characteristic admittances equal to the same value, allows one to determine numerical values of the odd and even mode characteristic admittances and the line lengths L1 and L2. References such as Pavlidis, together with these characteristic admittances may then be employed to specify the actual physical characteristics of the transmission line circuit in the embedding network, i.e., the widths, thicknesses and spacings of the conductors 1-3, the thickness of the dielectric substrate and the type of dielectric substrate 6, for the oscillator 10 in FIG. 1.

It is the use of at least a third line 3 in FIG. 1 that provides additional variables, namely $Y_{13}$, $Y_{23}$, $Y_{33}$, and hence $Y_{oe3}$ and $Y_{oo3}$, which enables the value of the output admittance $Y_L = R1$ to be specified as any practical value.

Figure 9:
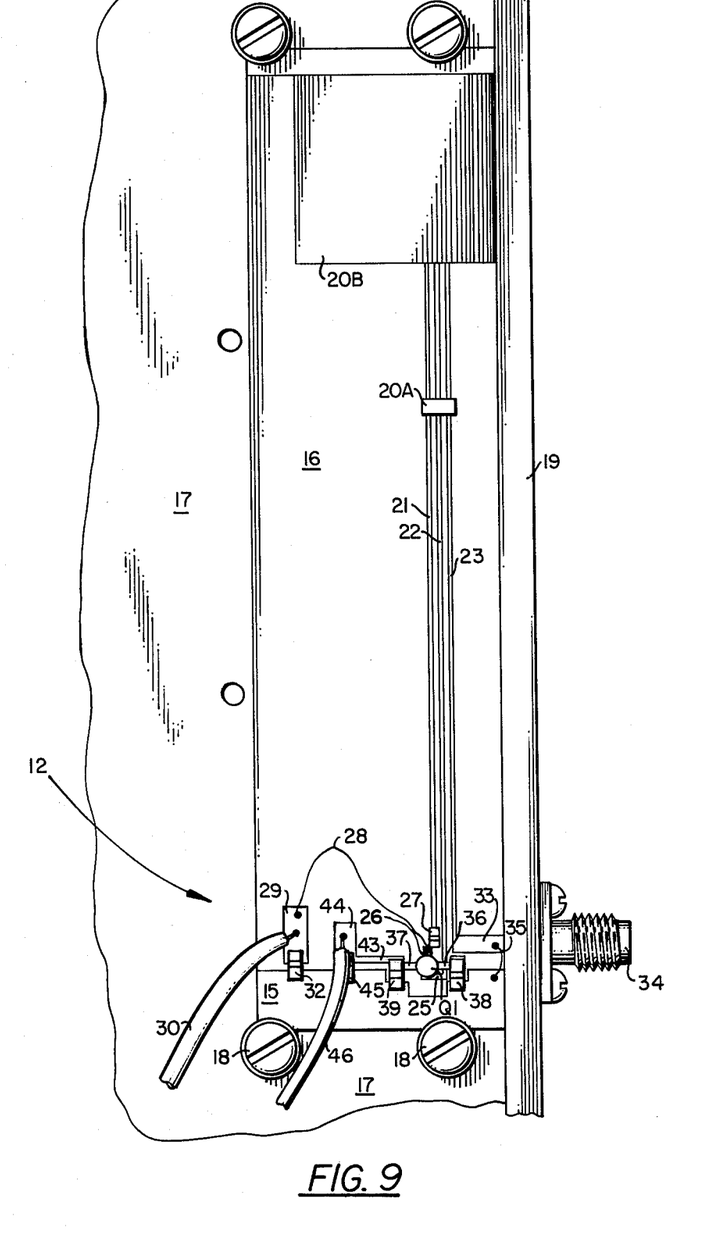
FIG. 9 is a perspective view of the top of a microstrip oscillator 12 embodying this invention that was built and successfully operated, and which has combined even and odd mode transmission lines that are straight.
Figure 10:
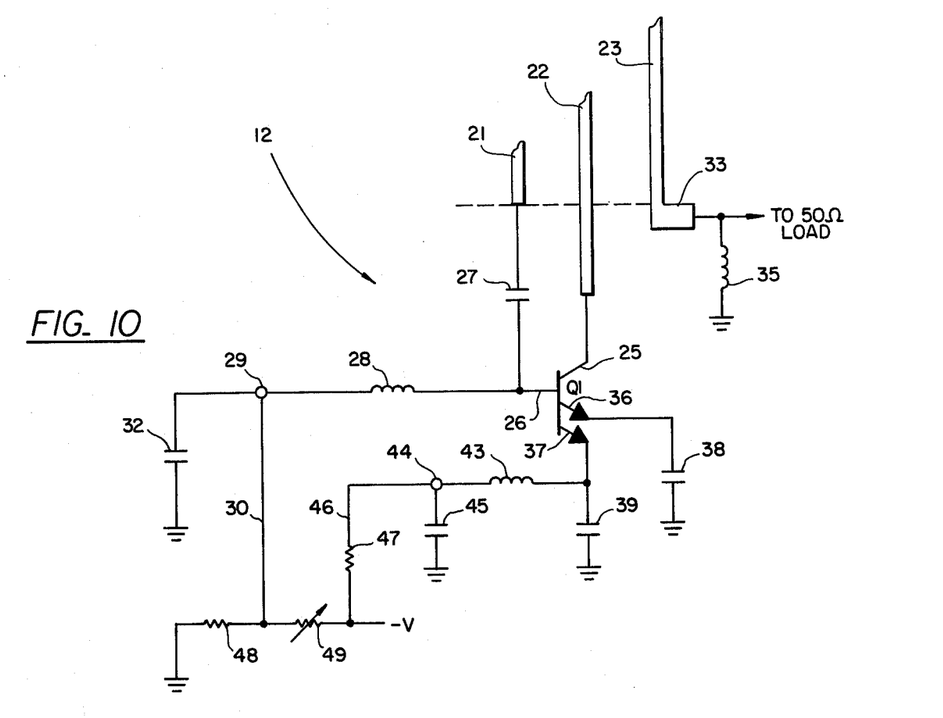
FIG. 10 is a schematic circuit diagram illustrating the bias circuit for the microstrip oscillator 12 in FIG. 9.

The microstrip oscillator 12 in FIG. 9, which was built and successfully operated over a frequency band of 1-2GHz, is similar to the oscillator 10 in FIG. 1. A schematic representation of oscillator 12 and the bias circuit therefor is shown in FIG. 10. Referring now to FIG. 9, conductive ground pad 15 and RF lines 21-23 are formed by printed circuit or thick film techniques on the top surface of a dielectric body or substrate 16 which is mechanically secured to an aluminum base plate 17 be screws 18. The ground pad 15 actually extends over one end-edge of and the full bottom surface of the substrate 16 so that it is in contact with the plate 17. An aluminum side plate 19 is attached to the base plate 17 and thus to the ground plane (not shown) formed on the underside of the substrate. Odd and even mode short circuits are provided on the RF lines 21–23 by copper strips 20A and 20B. The positions of these strips along the conductors 21–23 are varied to tune the oscillator 12.

The dielectric substrate 16 in oscillator 12 actually extended beyond the one ends of lines 21–23. The transistor Q1 was an HP35831E, option C04, microwave transistor manufactured by Hewlett Packard Corporation and packaged in a small pill type configuration. It is held to the substrate 16 by lead flexure and heat conducting paste which aids in cooling Q1. The Q1 collector-electrode 25 is directly electrically connected to the middle line 22. The Q1 base-electrode 26 is electrically connected through a 100 pF coupling capacitor 27 to the one end of line 21; and through a wire 28, pad 29 and wire 30 to a source of positive supply voltage. The wire 28 is a one inch length of number 40 copper wire which operates as an RF choke at microwave frequencies for blocking RF signals from the bias circuit. The pad 29 is also electrically connected through a 100 pF coupling capacitor 32 to ground. The RF line 23 is connected through a 50 ohm transmission line section 33 and the side plate 19 to an output coaxial connector 34 to which a 50 ohm resistive load is connected. A ½ inch length of number 40 copper wire 35, which operates as an RF choke at microwave frequencies for DC grounding the output line, is also connected between the line section 33 and the ground pad 15. The two emitter electrodes 36 and 37 of Q1 are electrically connected through associated 100 pF coupling capacitors 38 and 39 to the ground pad 15. The Q1 emitter electrode 37 is also connected through a printed circuit line 43 to pad 44. The printed line 43 is electrically an RF choke at microwave frequencies for blocking RF signals from the bias circuit. The pad 44 is electrically connected through a bypass capacitor 45 to ground and through a wire 46 to a negative supply voltage.

As is shown in FIG. 10, DC bias voltages are produced on lines 30 and 46 by a circuit comprising a 30 ohm series-emitter resistor 47 and a voltage divider including a fixed resistor 48 and a variable resistor 49 which are connected in series across terminals of a DC voltage source. The resistors 47–49 are located on a printed circuit card (not shown) that may be located below the plate 17 for convenience.

The capacitors 32, 38, 39 and 45 here are chip capacitors which bypass RF signals to ground to insure that there is no RF leakage into the bias circuit. The chip capacitor 27 also blocks any DC bias signal from the RF conductor 21. The RF choke wires 28, 35 and 43 pass any DC bias signals while at the same time blocking any RF signals from the bias circuit. The RF choke wire 35 also operates to inhibit very low frequency (approximately 10 Hz) oscillations in the output signal at connector 34.

In the oscillator 12, the widths and spacings of the lines 21–23, according to the designations in FIG. 1, were A = 0.14 inch, B = 0.011 inch, C = 0.011 inch, D = 0.014 inch and E = 0.010 inch. The lines 21–23 were made of gold and had a thickness H of 300 microinches. The dielectric substrate 16 measured 1 inch × 4 inches, was made of 99.5% alumina having a dielectric constant of 9.0, and had a thickness F of 0.050 inch. The ground plane on the bottom of the dielectric substrate was made of gold and had a thickness G of 300 microinches. The output power of oscillator 12 was approximately 21.5 dBm over a 1.0–2.0 GHz bandwidth. The positions of the shorting strips 20A and 20B along conductors 21–23 are changed to tune the oscillator. The position of strip 20B is about 1/10th as sensitive as the position of strip 20A in controlling the oscillator frequency. The position of the even mode shorting strip 20B primarily controls matching to obtain maximum output power from the oscillator.

A stripline oscillator that was also built and successfully operated was similar to the oscillator 12 in FIG. 9, except that it also included an upper dielectric member and associated ground plane. Also, the chip capacitors, RF choke wires, and Q1 were all located on the side of the lower dielectric structure which is opposite from the side thereof that supports the three RF conductors. Electrical connections were made to the RF lines by wires which were passed through the dielectric substrate. The upper and lower dielectric members were made of Duroid 5870 and had thicknesses of 0.062 inch. The width and spacings of the RF lines corresponding to designations in FIG. 1 were A = 0.027 inch, B = 0.013 inch, C = 0.019 inch, D = 0.017 inch, and E = 0.020 inch. The conductors were made of copper and had thicknesses of 0.0025 inch. In operating over a frequency band of 1.4–2.4 GHz, this oscillator had an output power of approximately 24 dBm. This oscillator employed an HP35832E microwave transistor which uses the same semiconductor chip as does the other HP transistor mentioned above. The transistor here, however, is fabricated in a stud-mounted package.

Figure 11:
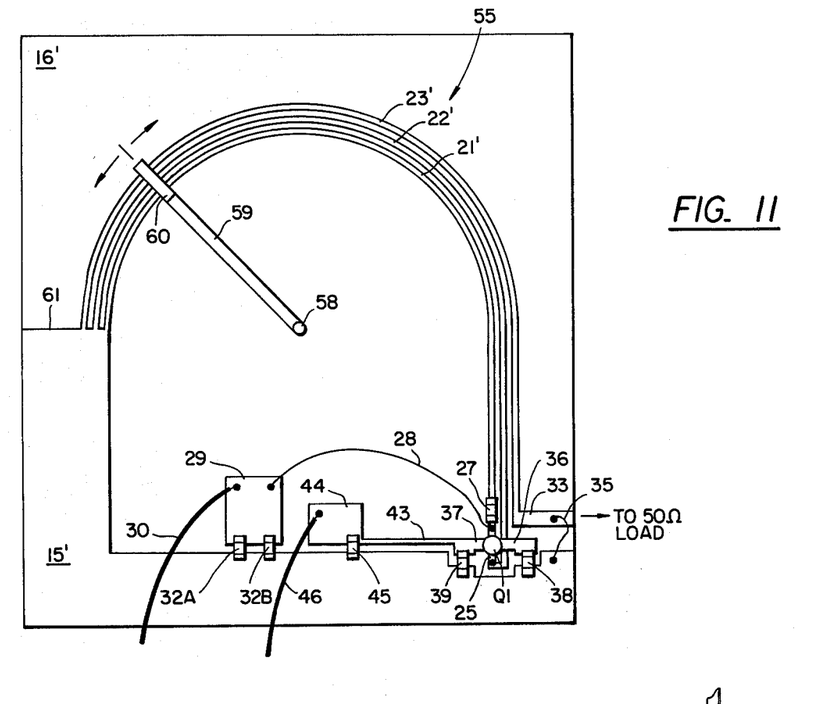
FIG. 11 is a top view of an alternate design of a microstrip oscillator 55 embodying this invention that was built and successfully operated and which has combined even and odd mode transmission line sections that are curved.

The microstrip oscillator 55 in FIG. 11 was also successfully built and operated. It is similar to the oscillator 12 in FIG. 9. The curved RF conductors 21'–23' are portions of circles having their centers at a point 58. An arm 59 has a peg on one end thereof located in a hole which is formed in the dielectric 16 coaxial with the center point 58. The other end 60 of the arm 59 has a flat conductive surface which contacts the RF conductors 21' – 23' to produce an odd mode short circuit on them. The arm 59 is rotated about the point 58 to accomplish tuning of oscillator 55. The ground pad 15' in FIG. 11 extends around to adjacent edges and sides (not shown) of the dielectric member 16' so as to contact the ground plane on the bottom of the dielectric. The pad 15' produces an even mode short circuit on the conductors 21' – 23' at the edge 61 of the former. The position of the even mode short circuit is changed by locating a conductive strip on the conductors 21' – 23' and the pad 15'. The bias circuit for oscillator 55 is substantially identical to that illustrated in FIG. 10.

Figure 12:
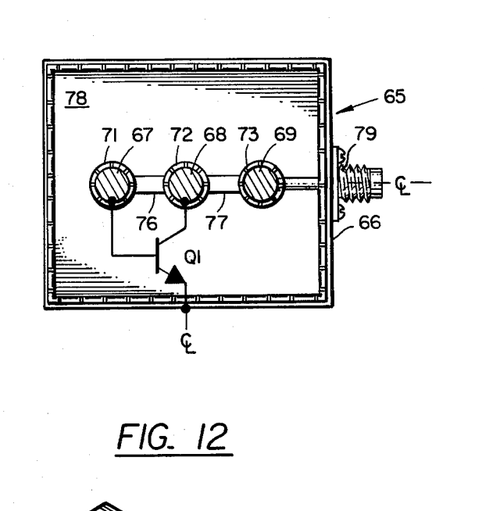
FIG. 12 is a section view of a microwave oscillator 65 embodying this invention and comprising a rectangular coaxial transmission line structure including combined odd and even mode transmission line sections.

The oscillator 65 including a coaxial transmission line type embedding network in FIG. 12 was also successfully built and operated. The embedding network in FIG. 12 comprises a square outer conductor 66 having three conductive rods 67, 68 and 69 dielectrically supported therein so as to be parallel to each other and walls of outer conductor 66. An odd mode short circuit is provided by sleeves 71, 72 and 73 which are coaxial with rods 67, 68 and 69, respectively; which have spring contact fingers making electrical contact with associated rods 67–69; and which are electrically connected together by rods 76 and 77. An even mode short circuit is provided by a moveable wall 78 having outer spring contact fingers electrically contacting interior walls of the outer conductor 66 and having inner spring contact fingers electrically contacting each of the inner conductor rods 67-69. In the oscillator 65, the cross section of the outer conductor measured 0.55 inch × 0.55 inch, the inner conductors 67 and 68 were 3/32 inch diameter rods and the third inner conductor 69 was a 1/16th inch diameter rod.

The transistor Q1 in this oscillator 65 was located inside of the coaxial transmission line with two electrodes connected to the larger diameter inner conductors 67 and 68 and the third electrode of Q1 connected to the outer conductor 66. An output signal was coupled from the coaxial connector 79 which was connected to the other or third inner conductor 69. The diameter of the conductor 69 is smaller than that of the other two inner conductors 67 and 68 in order to provide oscillator 65 with a desired output impedance which is a practicable value such as 50 ohms. The transistor Q1 here was a HP35832E microwave transistor. The coaxial line oscillator 65 operated over a frequency band of 1.4 – 3.4 GHz with an output power of approximately 20 dBm.

The oscillators in FIGS. 1, 9, 11 and 12 include combined odd and even mode transmission line sections. More specifically, the lengths L1 of lines 1-3 in FIG. 1, for example, comprise an odd mode transmission line section since they support primarily only odd modes. The lengths L1 + L2 of lines 1-3, however, comprise an even mode transmission line section since they support primarily only even modes.

Figure 13:
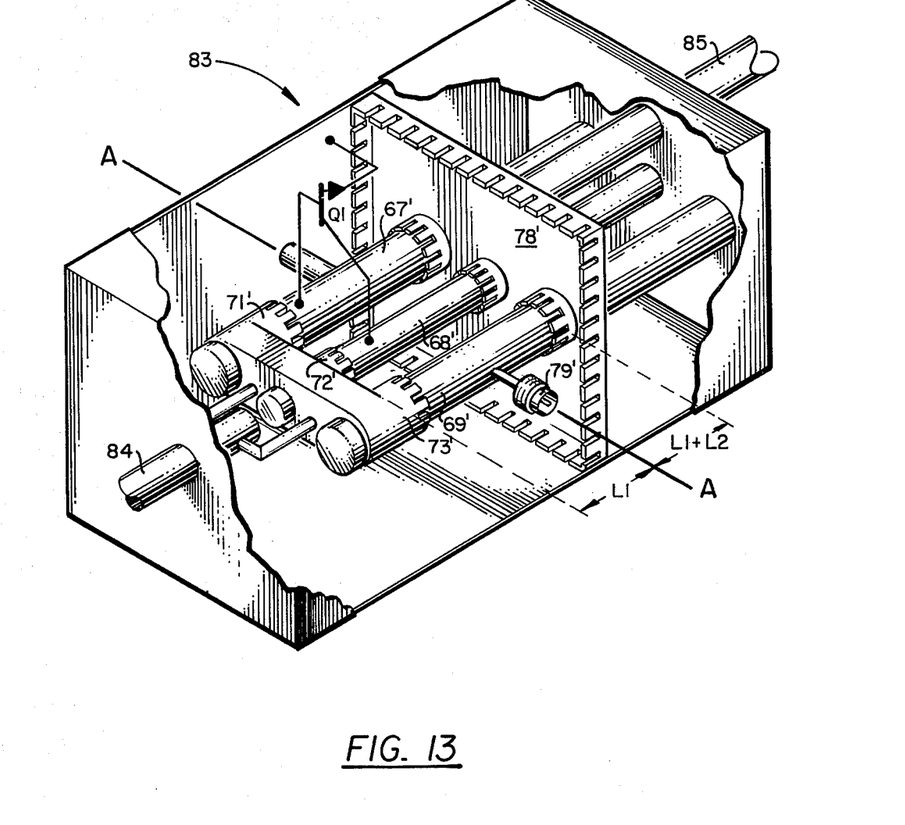
FIG. 13 is a perspective view of an alternate embodiment of this invention with top and side walls of a rectangular coaxial transmission line structure partially cut away to illustrate separate odd and even mode transmission line sections.

A coaxial transmission line type oscillator 83 including separate odd and even mode transmission line sections is illustrated in FIG. 13. The oscillator 83 is similar to the oscillator 65 in FIG. 12. The transistor Q1 in FIG. 13 is connected to RF conductors 67' and 68' in a plane that is perpendicular to the walls of outer conductor 66' and containing the line A — A which is perpendicular to the parallel conductors 67' – 69'. The sleeves 71' – 73' extend over one ends of associated conductors 67' – 69' to provide odd mode short circuits thereon and establish lengths L1 of RF conductors 67' – 69' which make up an odd mode transmission line section. The moveable wall 78' contacts the other ends of associated RF conductors for establishing the lengths L1 + L2 thereof which make up the even mode transmission line section. Dielectric rods 84 and 85 are connected to the sleeves 71' – 73' and the wall 78', respectively, for moving the positions of the short circuits provided thereby on the RF conductors. Although the two transmission line sections comprise different portions of the same three conductors 67' – 69', each line section may also be made up of a different group of three conductors having adjacent one ends thereof electrically connected to electrodes of Q1 and the output connector 79'.

Figure 14:
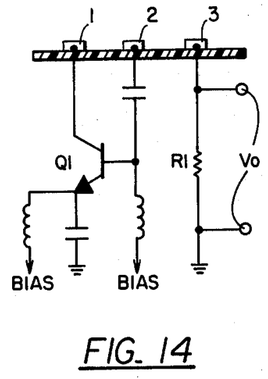
FIGS. 14–17 are schematic end views of microstrip oscillators embodying this invention and illustrating alternate connections of the microwave transistor Q1 and load impedance R1 to the transmission lines.
Figure 15:
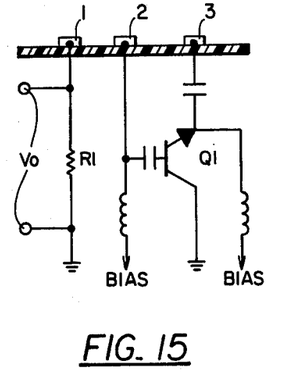
Figure 16:
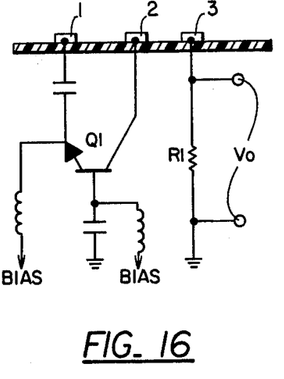
Figure 17:
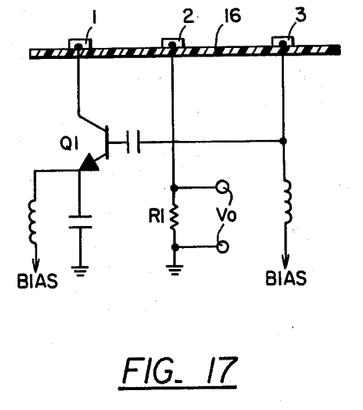

Although the transistor Q1 in the oscillators of FIGS. 1, 9, 12 and 13 are shown in a common emitter configuration with its collector and base electrodes connected to the middle and an outside one of the RF lines, respectively, these connections may be reversed, see FIG. 14. Also, Q1 may be connected in a common collector or a common base configuration as is shown in FIGS. 15 and 16, respectively. Further, Q1 may be connected with two of its electrodes connected to the two outside lines 1 and 3 and the load impedance connected to the middle line 2 as is shown in FIG. 17. The FIGS. 14 – 17 are only schematic representations of oscillators embodying this invention and do not include dc bias circuits which would be similar to that illustrated in FIG. 10. The coupling capacitors and RF chokes-coils in FIGS. 14 – 17 represent elements similar to those shown in FIGS. 9 and 10 and operate as noted in relation to oscillator 12.

Figure 18:
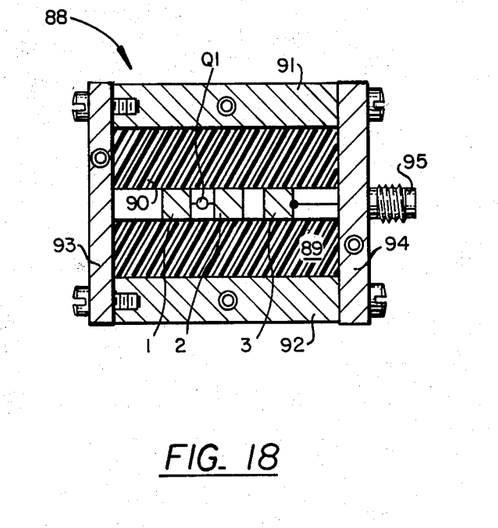
FIG. 18 is a section view of a stripline oscillator 88 embodying this invention.

A section view of a stripline oscillator 88 is shown in FIG. 18. The lines 1-3 of oscillator 88 are formed on a lower dielectric member 89, Q1 being connected to lines 1 and 2 and bonded to the substrate 89 by a heat conductive paste. An upper dielectric member 90 is positioned above the RF lines and dielectric member 89. A ground plane consisting of electrically conductive top and bottom plates 91 and 92 and side plates 93 and 94 and end plates (not shown) extends around the dielectric members 89 and 90. An output signal of oscillator 88 is coupled from the coaxial connector 95.

An amplitude varying input signal $V_i$ may be applied to the port 1C of the oscillator 10 in FIG. 1, for example, to provide a frequency modulated output signal. The resulting frequency modulated signal will not, however, be linear (i.e., the frequency will not vary linearly as a function of the amplitude of the input voltage).

Figure 19:
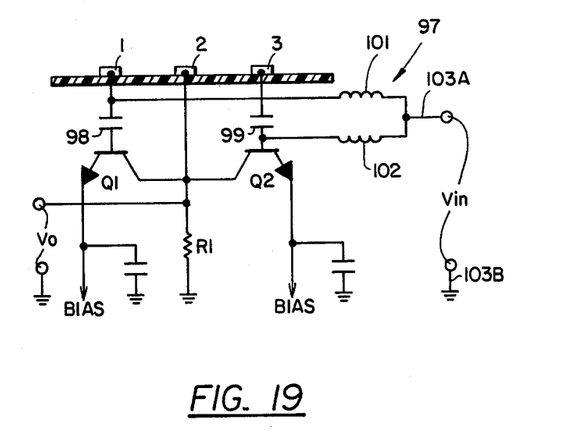
FIG. 19 is a schematic representation of an end view of an alternate embodiment of a microstrip oscillator circuit 97 including a pair of transistors Q1 and Q2 for providing increased output power, the circuit being arranged for receiving an input signal for operating as a frequency modulated oscillator.
Figure 20:
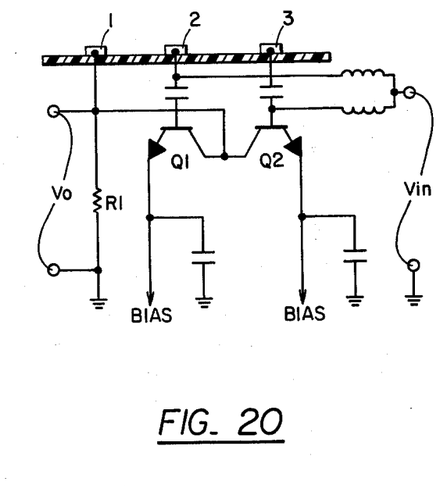
FIG. 20 is a schematic representation illustrating a modified form of the oscillator circuit 97 in FIG. 19.
Figure 21:
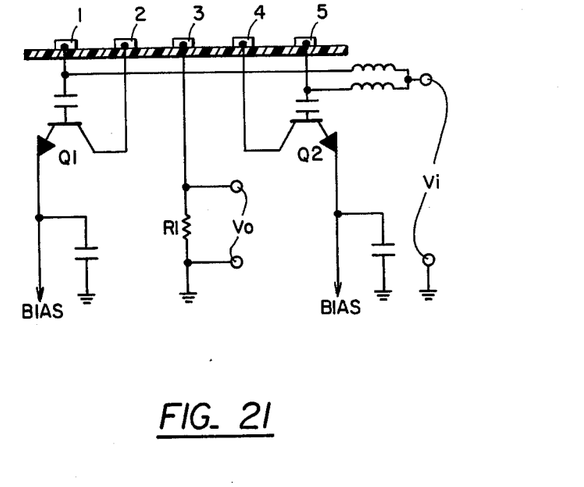
FIG. 21 is a schematic representation illustrating another modified form of the oscillator circuit 97 of FIG. 19.

In order to provide additional output power from an oscillator 10 embodying this invention, a second transistor Q2 maybe connected to the RF conductors 1-3 as is shown in FIGS. 19-21. DC bias circuitry is not shown in these FIGS. 19-21. The capacitors 98 and 99 there represent elements which are employed to block dc bias voltages from the RF lines. The coils 101 and 102 represent elements which are employed to isolate the RF input signals from the bias circuits. In the oscillator 97, the Q1 and Q2 base electrodes are connected to associate outside lines 1 and 3, respectively, and the collectors of both transistors being connected to the same-middle line 2 from which an output signal is coupled. A disadvantage in employing two transistors and three RF lines is that the versatility of varying the physical characteristics of the lines to cause the oscillator to have a desired output impedance is compromised. The design of such an oscillator is most readily accomplished by effectively dividing the circuit in FIG. 19 in half and considering it as two separate oscillators, each oscillator comprising a single transistor and a pair of transmission lines. The two oscillators can then be combined into the circuit of FIG. 19 by combining the two output lines into one and making the output impedance half that of the individual oscillators when separated. The microwave transistors Q1 and Q2 may also be connected so as to provide an output signal from an outside line 1, for example, see FIG. 20. It is also possible to connect the transistors in common collector or common base configurations. Further, more than two transistors and/or three transmission lines may be employed to provide additional power output and/or to enable the output impedance of the oscillator to be any desired value (see FIG. 21), although this complicates the design of the oscillator. In the oscillator in FIG. 21, Q1 and Q2 and associated RF lines would be designed as separate oscillators and then combined with the middle-output line 3.

When a varying input voltage $V_i$ is applied to lines 103A and 103B in FIG. 19, oscillator 97 operates as a frequency modulated oscillator (FMO). This FMO provides a linear tuning characteristic wherein the modulation sensitivity curve is essentially parabolic and symmetrical as desired. The microstrip FMO in FIG. 19 preferably comprises a pair of transistors Q1 and Q2 of the same type which have identical characteristics, although the latter is not an absolute requirement. The equations 1-6 are appropriate for defining the embedding network in FIG. 19. When Q1 and Q2 are identical, the transmission circuit is symmetrical about the middle conductor 2. The transistors Q1 and Q2 then oscillate at the same frequency, with their base electrodes at the same instantaneous voltages. This means that the admittance function $Y_{13}$ in equation 5 has no effect on the operation of the circuit. The Q1 and Q2 collector currents are then of equal magnitude, and of the same phases such that they add to produce a maximum output power.

If the Q1 and Q2 characteristics are different or if the associated RF circuits are not symmetrical, then the two halves of oscillator 97 will attempt to oscillate at slightly different frequencies. Since the lengths L1 of lines 1-3 are approximately a half wavelength long at the operating frequency (in order to provide the necessary 180° phase-shift in the RF circuit for oscillations to occur), the admittance $Y_{13}$ in equation 5 couples the Q1 and Q2 base electrodes tightly together. The Q1 and Q2 collector currents are also driven somewhat out-of-phase so that the voltage across the output port 2C is shifted from the balanced condition. This forces Q1 and Q2 to oscillate at a common frequency which may be different from the natural frequency of either transistor and the associated RF circuit. It has been determined experimentally that dissimilarities which occur in practice in Q1 and Q2 and/or associated RF circuits will not cause multiple frequency oscillation of oscillator 97.

In practice, the symmetry of the structure of oscillator 97 about the middle conductor 2 allows Q1 and Q2 and the associated pairs of lines 1, 2 and lines 2, 3 to be considered as individual dual-mode two conductor oscillators which are designed separately. The load R1 is divided equally between the two halves of oscillator 97 and the admittance $Y_{13}$ between the outside conductors 1 and 3 is considered to be zero. Differences in transistors and tuning circuits which occur in practice may be compensated for by tight coupling between the two oscillator halves in the completed circuit. The tight coupling between the Q1 and Q2 base electrodes due to $Y_{13}$ and between the collectors due to their common connection points serve to give the desired linearity characteristics during frequency modulation. Consider that Q1 and Q2 are driven at baseband by the same modulation signal $V_i$. If the operating frequency of one half of circuit 97 tends to deviate from the operating frequency of the combined oscillators, due to differences in transistors or associated embedding circuits, the admittance $Y_{13}$ between the base electrodes and the common collector couplings cooperate to force the two oscillators to operate at the same frequency.

Figure 22:
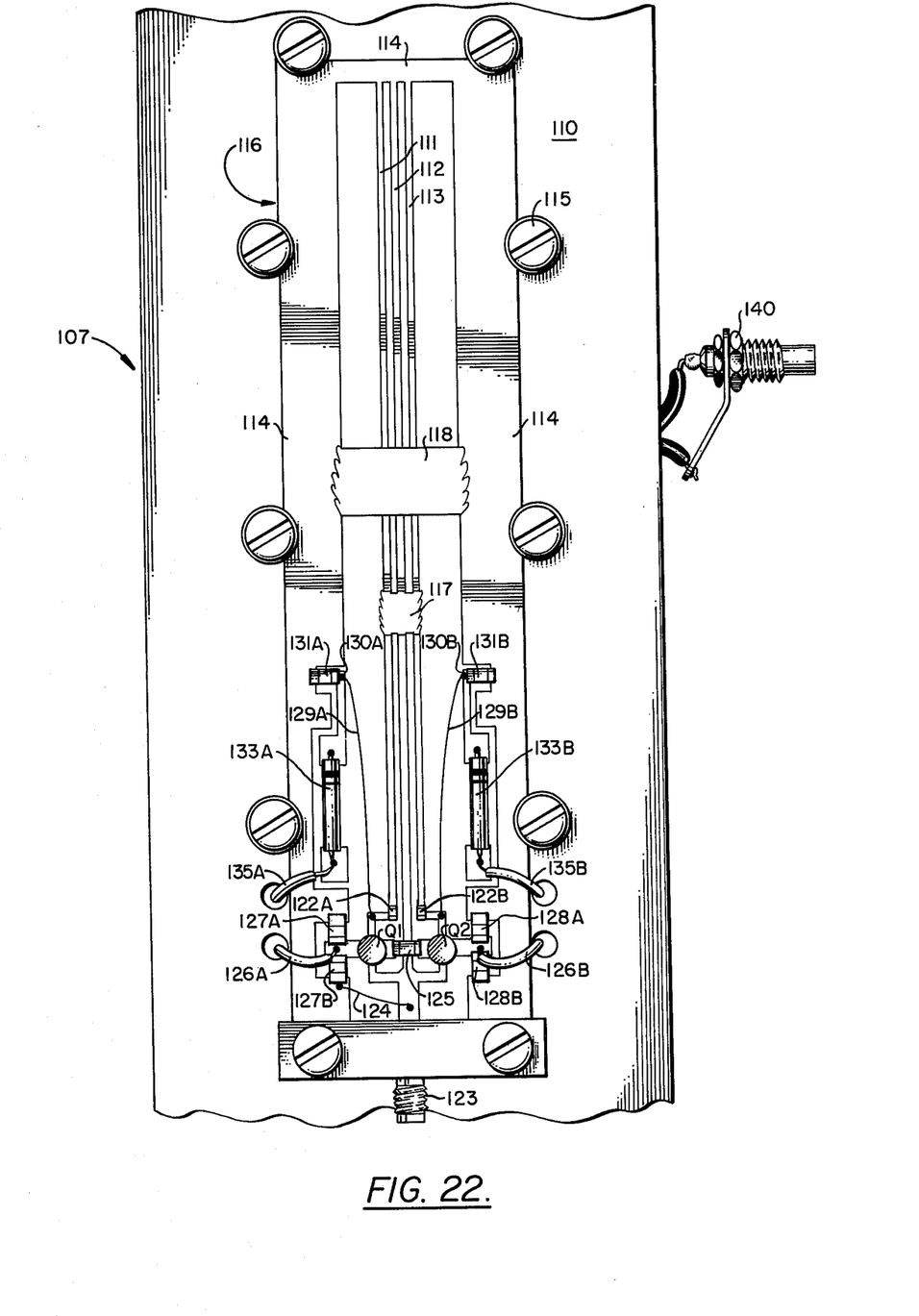
FIG. 22 is a top view of a microstrip oscillator 107 that is similar to the one in FIG. 19 and which was built and successfully operated.
Figure 23:
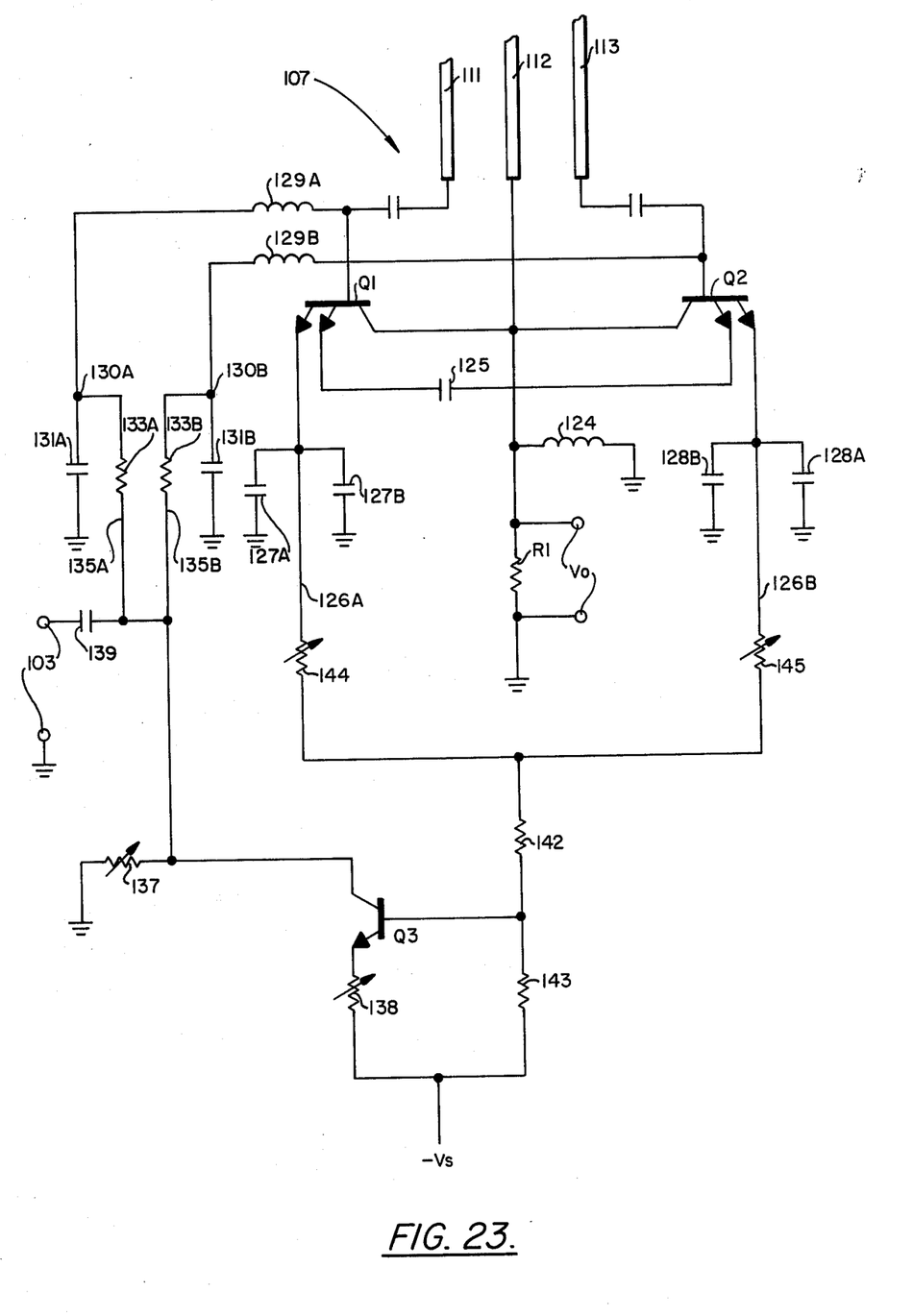
FIG. 23 is a schematic circuit diagram illustrating the bias circuit for the microstrip oscillator 107 of FIG. 22.

The microstrip oscillator 107 in FIG. 22 which was built and successfully operated as an FMO in a frequency band of 1.25 - 2.0 GHz is similar to the oscillator 97 in FIG. 19. A schematic representation of oscillator 107 and the bias circuit therefor is shown in FIG. 23. The three parallel RF conductors 111 - 113 and a ground pad 114 are formed on the top surface of a rectangularly shaped dielectric substrate 116. The ground pad 114 extends around opposite elongated edges and one end of the top surface of the dielectric member 116. This pad 114 also extends down associated sides of the substrate and contacts a ground plane surface which covers the bottom thereof. The dielectric member 116 is secured to an aluminum base plate 110 by screws 115.

One ends of lines 111 and 113 are electrically connected through chip capacitors 122A and 122B to base electrodes of associated transistors Q1 and Q2. These capacitors 122A and 122B pass RF signals while isolating the dc bias circuit from lines 111 and 113. The middle line 112 extends past Q1 and Q2 and is directly electrically connected to the collector electrodes thereof and to an output coaxial connector 123. The Q1 and Q2 collector electrodes are also connected to ground through a 1 inch length of number 40 copper wire 124 which is an RF choke at microwave frequencies. The other ends of the RF lines 111-113 are connected to the ground pad 114. Odd and even mode short circuits are formed by painting patches 117 and 118 of electrically conductive paste on the top of the substrate 116.

One emitter electrodes of Q1 and Q2 are electrically connected together by a chip capacitor 125. The other Q1 and Q2 emitter electrodes are connected through lines 126A and 126B to dc bias circuitry located below the plate 110, and to ground through associated pairs of chip capacitors 127A, 127B and 128A, 128B which prevent RF signals being coupled to the bias circuit. The Q1 and Q2 base electrodes are also electrically connected through the series combinations of associated lengths 129A and 129B of 1.0 inch long #40 copper wire and associated chip capacitors 131A and 131B to the ground pad 114. The junctions 130A and 130B of associated capacitors and chokewires are electrically connected through resistors 133A and 133B to wires 135A and 135B, respectively, which are also electrically connected to bias circuitry located below the plate 110. The wires 129A and 129B are RF chokes at microwave frequencies which block RF signals produced by the oscillator from the bias circuit. The chip capacitors 131A and 131B bypass RF signals which may appear at nodes 130A and 130B to ground. The four ohm resistors 133A and 133B aid in stabilizing the circuit at low frequencies such as 10 Hz.

In oscillator 107, the bias circuit establishes certain bias voltages on the Q1 and Q2 base electrodes. These base bias voltages are then caused to vary by the input signal $V_i$ at port 103 (connector 140) which causes the Q1 and Q2 collector currents to also change to vary the operating frequency of the FMO. Since the Q1 and Q2 collector electrodes are connected in parallel, the collector currents of these transistors increase and decrease together rather than operating in push-pull.

The bias circuit for oscillator 107 is illustrated in FIG. 23 and comprises a current amplifier including a transistor Q3 having its emitter-collector junction and the variable resistors 137 and 138 electrically connected in series between ground and a negative supply voltage. The Q3 collector electrode is electrically connected through lines 135A and 135B to the Q1 and Q2 base electrodes, and through a dc blocking capacitor 139 to the port 103 across which an input signal $V_i$ is applied to the FMO. The Q3 base electrode is electrically connected to the junction of resistors 142 and 143, the latter also being electrically connected to the supply voltage. The other end of resistor 142 is connected through variable resistors 144 and 145 to the Q1 and Q2 emitter electrodes, respectively.

The potentiometers 137 and 138 are adjusted to bias Q1 and Q2 so as to set the output power of the oscillator 107. These resistors are not to be employed to set Q1 and Q2 to operate with different current gains. The resistors 138, 142 and 143 supply a constant drive current to Q1 and Q2. This, together with contributions of Q3, operate to provide a desired modulation linearity. The potentiometer 138 is a linearizing control which is varied to change the operating point of Q3 in order to obtain a desired parabolic modulation sensitivity curve. Stated differently, resistor 138 is adjusted to bias Q3 to operate such that on either side of a prescribed frequency of oscillation, the modulation sensitivity of oscillator 107 varies symmetrically as the oscillator 107 is tuned equal frequency increments above and below this prescribed frequency by an input signal at port 103 which may vary from 10 Hz to 10 MHz, for example.

The value of resistor 137 may also be varied to compensate for changes in the electrical characteristics of Q1 and Q2 which are caused by temperature changes. Adjustment of resistor 137 will also compensate for frequency changes in the oscillator 107 that are caused by changes in the physical lengths L1 of the RF lines. The transistor Q3 operates at baseband as a current amplifier which frequency stabilizes Q1 and Q2 against temperature variations. If the ambient temperature increases, the Q1 and Q2 collector currents increase, for a fixed bias point which causes the oscillation frequency thereof to decrease. These changes in Q1 and Q2 collector currents, however, cause the voltage across resistor 143 to increase to bias Q3 to draw additional collector current through resistor 137. The resultant change in bias voltage across resistor 137 decreases the base bias on Q1 and Q2 which causes the collector currents thereof to decrease to hold the operating frequency of the oscillator substantially constant. It has been determined that changes in Q1 and Q2 collector currents that are caused by changes in the $h_{FE}$ parameters thereof will never give a negative slope to the oscillator frequency-vs.-collector current of Q1 and Q2, which means Q1 and Q2 alone cannot be biased so as to compensate for frequency drift with temperature. Changes in the Q1 and Q2 collector currents that are caused by changes in the $h_{FE}$ parameter of Q3, however, always cause the oscillator frequency-vs.-collector current of Q1 and Q2 to have a negative slope, which means that suitable circuit values may be obtained to minimize or cancel Q1 and Q2 current changes with temperature, hence stabilizing the oscillator with temperature changes.

In operation, an input signal $V_i$ which may vary from 10 Hz to 10 MHz, for example, is coupled to port 103. Since oscillator 107 is physically and electrically symmetrical about the middle line 112, it essentially operates at the natural frequency of Q1 and Q2. The input signal at port 103 is coupled to the Q1 and Q2 base electrodes to cause their base-emitter voltages and thus their base currents to change. An increase in the Q1 and Q2 base currents causes their collector currents to also increase to decrease the operating frequency of the FMO. If Q1, for example, draws more collector current than Q2 due to differences in transistors, then Q1 will tend to have more effect on the change in the operating frequency of the FMO than will the transistor Q2. The quasi-constant current provided by Q3 and resistors 142 and 143, however, provides offsetting changes in the collector currents drawn by Q1 and Q2 with the result that modulating both Q1 and Q2 causes linearization of modulation by compensating for differences in the tuning rate of the two oscillator halves (Q1 and Q2). Stated differently, if one of the microwave transistors tends to change frequency more than the other, then the phases and magnitudes of their base voltages will differ causing admittance $Y_{13}$ to couple the Q1 and Q2 bases around the admittance loop $Y_{13} - Y_{23} - Y_{12}$ so as to maintain the modulation sensitivity symmetrical about the operating frequency of the unmodulated oscillator 107.

In the oscillator 107 that was built and satisfactorily operated as an FMO, Q1 and Q2 were HP35831E microwave transistors. An FMO circuit employing option C04 ones of these transistors was also satisfactorily operated. The dielectric substrate 116 in the oscillator 107 measured 1 inch × 4 inches × 0.050 inch and was made of alumina having a dielectric constant of 9.5. The widths and spacings of the RF lines, as specified in FIG. 1, were A = E = 0.0207 inch; B = D = 0.008 inch; and C = 0.021 inch. The oscillator 107 was tuned over a frequency band from approximately 1.25 to 2.0 GHz with a power output of 100 mW. The modulation sensititivity was parabolic and substantially symmetrical over ±4 MHz of the operating frequency with a nominal change from a constant modulation sensitivity of approximately 2 MHz per volt. The idle noise, i.e., the incidental FM noise in the absence of modulation, was quite low.

Although this invention is described in relation to preferred embodiments thereof, modifications and variations thereof will occur to those skilled in the art without departing from the spirit of this invention. By way of example, the transistors Q1 and Q2 may be other than bipolar transistors. They may also be vacuum tubes, FET's, and other types of active elements which operate at microwave frequencies. Also, the RF circuit may be any type of transmission line or electromagnetic wave propagating structure which will support odd and even mode fields such as rectangular waveguide, circular waveguide, elliptical waveguide, and higher mode coaxial transmission line. Further, each of the odd and even mode short circuited transmission lines in FIG. 1, for example, may comprise separate groups of conductors. That is, the odd mode short circuit strip 7 maybe on one group of conductors and the even mode short circuit strip 8 be in another-different group of conductors. The scope of this invention is therefore to be determined from the attached claims rather than from the above-detailed descriptions of preferred embodiments thereof. Although FIGS. 10 and 23 show transistors with two emitters, they are actually two emitter leads shown in the figures and the transistor has only one emitter.

What is claimed is:

1. A microwave oscillator comprising:
first transmission line means comprising ground reference surface means and at least three parallel conductors supported in a parallel spaced apart relation with respect to each other and said ground means so as to be capable of supporting both even and odd mode fields;
second transmission line means comprising said ground reference surface means and at least three conductors, which may be at least portions of associated conductors of said first transmission line means, supported in a parallel spaced apart relationship with respect to each other and said ground means so as to be capable of supporting both even and odd mode fields;
first means short-circuiting conductors of said first transmission line means together and to said ground means at first points on these conductors;
second means short-circuiting conductors of said second transmission line means together at second points thereon which are insulated from said ground means;

first amplifier means electrically connected to said first and second transmission line means such that said first and second short-circuited transmission line means form an external feedback path type embedding network for said first amplifier means for causing the latter to oscillate; and means coupling an output signal from one of said amplifying means and said first and second transmission line means.

2. The oscillator according to claim 1 wherein said first points are spaced from third points on conductors of said first transmission line means; and said second points are spaced from fourth points (which may be the same as said third points) on conductors of said second transmission line means; said first amplifier means being electrically connected to said third and fourth points on associated first and second conductors of both of said first and second transmission line means.

3. The oscillator according to claim 2 wherein said first transmission line means between said first and third points thereon supports primarily only even mode fields, and wherein said second transmission line means between said second and fourth points thereon support primarily only odd mode fields.

4. The oscillator according to claim 3 wherein said output coupling means simultaneously couples output signals from one conductors of both of said first and said second transmission line means which may be different from said first and second conductors thereof.

5. The oscillator according to claim 4 wherein said first and second conductors of associated first and second transmission line means are located adjacent each other and said output coupling means couples the output signal from third conductors of said first and second transmission line means which are different from and adjacent to a conductor of the associated first and second conductors.

6. The oscillator according to claim 5 wherein the oscillator operates into a prescribed load impedance and the physical characteristics of said first and second transmission line means are selected to match the output characteristic impedance of the oscillator to the load impedance.

7. The oscillator according to claim 5 wherein said first and second transmission line means comprise pluralities of microstrip transmission lines.

8. The oscillator according to claim 7 wherein said first amplifying means comprises a microwave transistor which is electrically connected in a common emitter configuration with its emitter electrode electrically connected to said ground plane means, and its collector and base electrodes electrically connected to associated adjacent conductors, said output means coupling an output signal from a conductor which is adjacent to one of said conductors that is electrically connected to said transistor.

9. The oscillator according to claim 1 wherein the positions of said short-circuits are variable for tuning the oscillator.

10. The oscillator according to claim 2 wherein said first and second transmission line means comprise different lengths of the same conductors.

11. The oscillator according to claim 3 wherein said conductors are in at least substantially the same plane.

12. The oscillator according to claim 11 wherein said output coupling means simultaneously couples output signals from one conductors of both of said first and said second transmission line means which may be different from said first and second conductors thereof.

13. The oscillator according to claim 11 including a second amplifying means electrically connected between said ground plane means and third and fourth points on two conductors of said first and second transmission line means, where said two conductors associated with said second amplifying means may be different from said two conductors associated with said first amplifying means; said output coupling means coupling an output signal from one conductors of each of said first and second transmission line means which may be different from said aforementioned two pairs of conductors.

14. The oscillator according to claim 2 including a second amplifying means electrically connected between said ground plane means and third and fourth points on two conductors of said first and second transmission line means, where said two conductors associated with said second amplifying means may be different from said two conductors associated with said first amplifying means; said output coupling means coupling an output signal from one conductors of each of said first and second transmission line means which may be different from said aforementioned two pairs of conductors.

15. The oscillator according to claim 14 wherein conductors of the two transmission line means that are connected to said first and second amplifying means are located adjacent to each other, one conductor of each transmission line means which is intermediate two other conductors thereof that are connected to associated ones of said first and second amplifying means being common to both of said amplifying means, said coupling means coupling the output signal from said one-common conductors of said first and second transmission line means.

16. The oscillator according to claim 15 wherein a variable input voltage is applied to both of said amplifiers for causing the output signal of the oscillator to be frequency modulated.

17. The oscillator according to claim 14 wherein each of said amplifying means comprises an associated microwave transistor electrically connected in a common emitter configuration with its emitter electrode electrically connected to said ground means, its collector electrode electrically connected to a given conductor, and its base electrode electrically connected to an associated one of said conductors which is adjacent to said given conductor, said output coupling means coupling the output signal of the oscillator between the given conductor and said ground plane means.

18. A microwave oscillator comprising:

transmission line means comprising a ground reference surface means and at least three parallel conductors which are supported in a parallel spaced apart relationship with respect to each other and said ground means so as to be capable of supporting both even and odd modes of propagating electromagnetic waves;

first means short-circuiting all of said conductors together at first points thereon which are insulated from said ground means;

second means short-circuiting all of said conductors of said transmission line means together and to said ground means at second points on said conductors which may be spaced from said first points thereon;

first amplifying means coupled to said transmission line means such that the latter forms an external feedback path around the former for causing it to oscillate; and means for coupling an output signal from one of said first amplifying means and said transmission line means.

19. The oscillator according to claim 18 wherein said first amplifying means is coupled between said ground plane means and first and second ones of said conductors, said output coupling means coupling an output signal from one of said conductors which may be different from said first and second ones thereof.

20. The oscillator according to claim 19 wherein said first and second conductors are adjacent each other and said output coupling means is operative for coupling an output signal from a third conductor which is adjacent to one of said first and second conductors.

21. The oscillator according to claim 20 wherein said transmission line means comprises a plurality of microstrip transmission lines and said first amplifier comprises a microwave transistor electrically connected in a common emitter configuration with an emitter electrode electrically connected to said ground means, and base and collector electrodes connected to associated adjacent first and second conductors; the oscillator operating into a prescribed load impedance electrically connected between said third conductor, which is adjacent to one of said first and second conductors, and said ground means; the physical characteristics and dimensions of said microstrip transmission line comprising said first, second and third conductors being selected to match the output characteristic admittance of the oscillator to the load admittance.

22. The oscillator according to claim 18 wherein said first amplifying means is electrically connected between said ground means and two of said conductors; and including second amplifying means electrically connected between said ground plane means and two of said conductors which may be different from said two conductors associated with said first amplifying means.

23. The oscillator according to claim 22 wherein said first amplifier means is coupled to first and second adjacent conductors, and said second amplifying means is connected to said second conductor and a third conductor adjacent to said second conductor; said output coupling means coupling an output signal from said second conductor which is common to said first and second amplifying means.

24. The oscillator according to claim 23 wherein an amplitude varying input signal is coupled to each of said first and second amplifying means for causing the output signal of the oscillator to be frequency modulated.

25. The oscillator according to claim 23 wherein said ground plane means together with associated ones of said first, second and third conductors comprise a plurality of microstrip transmission lines.

26. The oscillator according to claim 25 wherein said first and second amplifying means comprise associated first and second microwave transistors having emitter electrodes electrically connected to said ground plane, having base electrodes electrically connected to said first and third conductors, respectively, and having their collector electrodes both electrically connected to said second-common conductor.

* * * * *